US008260115B2

(12) United States Patent
Selve et al.

(10) Patent No.: US 8,260,115 B2
(45) Date of Patent: Sep. 4, 2012

(54) METHOD AND PRODUCT FOR COPY PROTECTION OF OPTICAL DISCS USING UNBALANCED DC CONTENT

(75) Inventors: Philippe Marcel Henri Selve, Woodley (GB); Victor Kovner, Woodley (GB); Richard A. A. Heylen, Leeds (GB)

(73) Assignee: Rovi Europe Limited, Santa Clara, CA (US)

( * ) Notice: Subject to any disclaimer, the term of this patent is extended or adjusted under 35 U.S.C. 154(b) by 863 days.

(21) Appl. No.: 12/392,970

(22) Filed: Feb. 25, 2009

(65) Prior Publication Data

US 2009/0201781 A1 Aug. 13, 2009

Related U.S. Application Data

(63) Continuation of application No. 10/505,087, filed on Aug. 13, 2004, now Pat. No. 7,539,394.

(30) Foreign Application Priority Data

Jan. 23, 2004 (GB) .......................... GB2004/000241

(51) Int. Cl.
*H04N 9/80* (2006.01)
*H04N 9/79* (2006.01)
(52) U.S. Cl. ........................................ 386/252; 386/304
(58) Field of Classification Search .................. None
See application file for complete search history.

(56) References Cited

U.S. PATENT DOCUMENTS

| | | | |
|---|---|---|---|
| 4,603,413 A | 7/1986 | Sinjou et al. | |
| 5,194,965 A * | 3/1993 | Quan et al. | 386/245 |
| 5,659,613 A | 8/1997 | Copeland et al. | |
| 5,699,434 A | 12/1997 | Hogan | |
| 5,703,858 A | 12/1997 | Mitchell et al. | |
| 5,748,119 A | 5/1998 | Ko | |
| 5,787,068 A | 7/1998 | Arps | |
| 5,828,754 A | 10/1998 | Hogan | |
| 5,832,088 A | 11/1998 | Nakajima et al. | |
| 5,859,601 A | 1/1999 | Moon et al. | |
| 5,898,394 A | 4/1999 | Kobayashi et al. | |
| 6,028,936 A | 2/2000 | Hillis | |

(Continued)

FOREIGN PATENT DOCUMENTS

EP 0 347 934 A2 12/1989

(Continued)

OTHER PUBLICATIONS

EP Search Report dated Feb. 25, 2005 for EP 05 00 0302, two pages.

(Continued)

*Primary Examiner* — William C Vaughn, Jr.
*Assistant Examiner* — Gelek W Topgyal
(74) *Attorney, Agent, or Firm* — Morrison & Foerster LLP

(57) ABSTRACT

The present invention relates to a method of copy protecting optical discs, such as CDs or DVDs. Instead of encoding data onto the CD-ROMs in a conventional manner which ensures balanced dc content, for copy protection the digital data is encoded and recorded onto the optical disc such that it is arranged to give some of the recorded digital data highly unbalanced dc content. Thus, for example, the DSV (digital sum value) value of the encoded data is recorded so that the DSV value changes continuously once 50 frames of data or more.

31 Claims, 8 Drawing Sheets

U.S. PATENT DOCUMENTS

Figure 1:
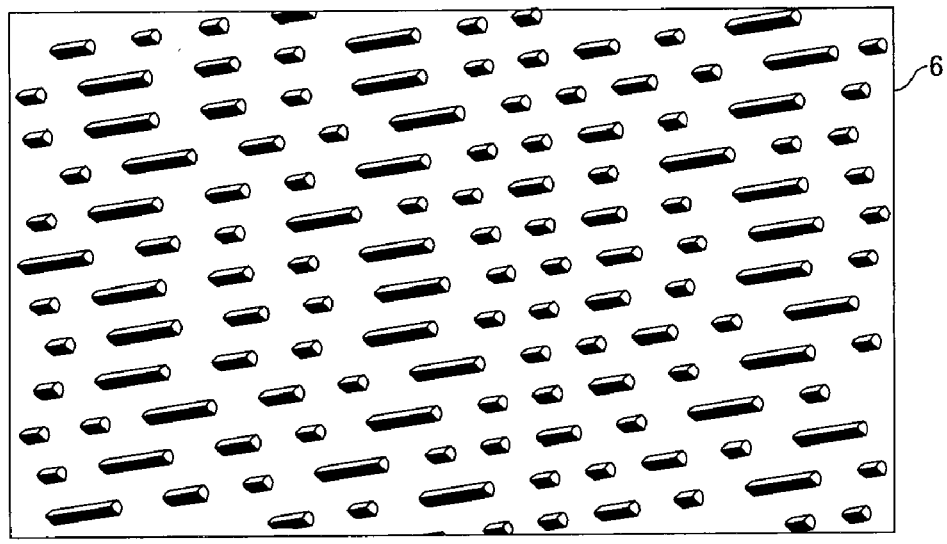

| | | | |
|---|---|---|---|
| 6,058,191 A * | 5/2000 | Quan | 380/203 |
| 6,076,165 A | 6/2000 | Maenza | |
| 6,278,386 B1 | 8/2001 | Hogan | |
| 6,317,397 B1 | 11/2001 | Deguchi et al. | |
| 6,353,890 B1 | 3/2002 | Newman | |
| 6,421,750 B1 | 7/2002 | Gunther et al. | |
| 6,694,023 B1 | 2/2004 | Kim | |
| 6,700,989 B1 | 3/2004 | Itoh et al. | |
| 6,782,190 B1 | 8/2004 | Morito | |
| 6,839,312 B2 | 1/2005 | Heylen et al. | |
| 7,030,788 B2 | 4/2006 | Aida et al. | |
| 2001/0011237 A1 | 8/2001 | Tanaka et al. | |
| 2002/0076046 A1 | 6/2002 | Heylen | |
| 2002/0159355 A1 | 10/2002 | Heylen et al. | |
| 2004/0027940 A1 | 2/2004 | Minamino et al. | |
| 2004/0037201 A1 | 2/2004 | Sako et al. | |
| 2004/0062168 A1 | 4/2004 | Kobari et al. | |
| 2004/0062169 A1 | 4/2004 | Coene et al. | |
| 2004/0098656 A1 | 5/2004 | Ohno et al. | |
| 2004/0151105 A1 | 8/2004 | Aida et al. | |
| 2004/0207545 A1 | 10/2004 | Kayanuma et al. | |
| 2005/0044083 A1 | 2/2005 | Sako | |
| 2005/0163315 A1 | 7/2005 | Jackson et al. | |
| 2005/0193313 A1 | 9/2005 | Heylen et al. | |
| 2005/0270190 A1 * | 12/2005 | Basile | 341/50 |
| 2006/0202869 A1 | 9/2006 | Aida et al. | |

FOREIGN PATENT DOCUMENTS

| | | |
|---|---|---|
| EP | 0 347 934 A3 | 12/1989 |
| EP | 0 347 934 B1 | 12/1989 |
| EP | 0 791 923 A2 | 8/1997 |
| EP | 0 854 482 A1 | 7/1998 |
| EP | 0 854 482 B1 | 7/1998 |
| EP | 0 918 235 A1 | 5/1999 |
| EP | 0 918 326 A1 | 5/1999 |
| EP | 1 011 103 A1 | 6/2000 |
| EP | 1 355 306 A1 | 10/2003 |
| EP | 1 396 857 A1 | 3/2004 |
| EP | 1 418 584 A1 | 5/2004 |
| EP | 1 494 235 A1 | 8/2004 |
| EP | 1 505 598 A1 | 2/2005 |
| EP | 1 521 262 A1 | 4/2005 |
| GB | 2 397 687 A | 7/2004 |
| GB | 2 369 718 B | 8/2004 |
| JP | 2002-105278 A | 4/2002 |
| JP | 2002-175662 A | 6/2002 |
| WO | WO-98/02885 A1 | 1/1998 |
| WO | WO-98/54713 A1 | 12/1998 |
| WO | WO-98/57413 A1 | 12/1998 |
| WO | WO-00/74503 A1 | 12/2000 |
| WO | WO-02/11136 A1 | 2/2002 |
| WO | WO-03/085668 A1 | 10/2003 |
| WO | WO-2004/075185 A1 | 9/2004 |
| WO | WO-2004/075186 A1 | 9/2004 |

OTHER PUBLICATIONS

Kalker, T. (1999). "System Issues in Digital Image and Video Watermarking for Copy Protection," Multimedia Computing and Systems 1999, IEEE International Conference, Florence, Italy, Jun. 7-11, 1999, Los Alamitos, CA USA IEEE Comput. Soc., US 6/799, pp. 562-567.

Menezes, A. et al. (1997). "Handbook of Applied Cryptography," CRC Press LLC, pp. 20-23.

PCT Search Report dated Oct. 25, 2001 for PCT/GB01/03364, 2 pages.

PCT Search Report dated May 24, 2004 for PCT/GB2004/00643, 2 pages.

Schouhamer Immink, K.A., (Aug. 1, 1995). "EFMPlus: The Coding Format of the Multimedia Compact Disc," IEEE Transactions on Consumer Electronics, IEEE, Inc., New York, US, 41(3):491-497.

* cited by examiner

METHOD AND PRODUCT FOR COPY PROTECTION OF OPTICAL DISCS USING UNBALANCED DC CONTENT

CROSS REFERENCE TO RELATED APPLICATION

This application is a continuation application of U.S. application Ser. No. 10/505,087 filed Aug. 13, 2004, now U.S. Pat. No. 7,539,394, which claims priority to International Application Number PCT/GB2004/000241, having an international filing date of Jan. 23, 2004, each of which are incorporated herein by reference in its entirety.

BACKGROUND

The present invention relates to a method of copy protecting optical discs, to optical discs when so copy protected, and to a data file for enabling digital data to be recorded in an encoded and copy protected form on an optical disc.

SUMMARY

Optical discs, such as the various formats of compact discs (CDs) and of digital versatile discs (DVDs) are increasingly used for carrying information for many different applications. The information encoded onto the optical discs is generally very valuable and accordingly, they are increasingly copied by counterfeiters. Furthermore, recordable CDs, and CD writers for writing the information content from one disc to such recordable discs, are now readily available to the domestic consumer. Recordable DVDs and DVD writers are expected to become as readily available in the short term. This means that new and effective methods for copy protecting optical discs are required.

The present invention seeks to provide new methods of copy protection.

According to a first aspect of the present invention there is provided a method of copy protecting an optical disc comprising the step of encoding and recording digital data onto the optical disc in a manner which is arranged to give some of the recorded digital data unbalanced dc content.

Preferably, the unbalanced dc content is given to selected areas of the recorded digital data on the disc.

In the main, players of the information on an optical disc can play the information recorded thereon despite the unbalanced dc content. However, readers of the information will experience difficulties in accessing the information, and, for example, may be caused to jitter. The unbalanced dc content causes graver problems when attempts are made to copy extracted data by known "ripping" techniques.

In this respect, in this specification the term "player" is used to refer to players and drives arranged or controlled to play the data on an optical disc. This might be, for example, the audio data on a digital audio compact disc (CD-DA), or the video data on a digital versatile disc (DVD). Such players will include, therefore, commercially available CD music players which function solely to play the music or other audio on the CD, and commercially available DVD players which function solely to play the films or other video on the DVD. It is generally required that the copy protection methods of the invention do not generally impinge on the normal operation of such "players".

In this specification the term "data reader" is used to refer to all players and drives arranged or controlled to read the data on the optical disc, for example, by extracting or ripping the data from the disc. Such players will include, therefore, CD-ROM and CD-I drives when configured or controlled to read or extract audio data from a CD. In this respect, it is required to enable drives to play legitimate optical discs, but to prevent them from being used to extract the data from the discs or to make usable copies of the discs.

In an embodiment, methods of the invention further comprise predetermining the selected areas of the recorded digital data which are to be given unbalanced dc content.

Where the selected areas are predetermined, methods of the invention may also act to provide for authentication of genuine discs and/or to provide signatures for discs. In this respect, to establish if a disc is genuine or if a signature has been provided, it is necessary only to look to the predetermined selected areas to see if they contain unbalanced dc content.

In an alternative method of the invention, the method further comprises randomly selecting the selected areas of the recorded digital data which are to be given unbalanced dc content.

In an embodiment, the method may further comprise recording the digital data onto the optical disc in frames, and providing that each selected area having unbalanced dc content contains less than 100 frames and the unbalanced dc content changes continuously over at least 50 frames.

The method may comprise recording the digital data onto the optical disc in frames arranged into sectors each having a plurality of frames, and providing that each selected area having unbalanced dc content contains less than 2 sectors.

For example, each sector contains 98 frames.

The selected areas which are given unbalanced dc content are preferably restricted in size such that a player can treat the tracking errors caused thereby as burst errors. In this situation, therefore, a player will generally be able to continue playing information from the disc without degradation.

In an embodiment, the method further comprises giving some of the recorded digital data unbalanced dc content by providing the recorded digital data with poor DSV characteristics.

For example, the DSV of the recorded digital data may have a rapid rate of change.

Additionally and/or alternatively, the DSV of the recorded digital data may have high absolute values.

Additionally and/or alternatively, the DSV of the recorded digital data may have substantial low frequency components.

Preferably, the recorded digital data on the optical disc is given unbalanced dc content by encoding selected areas of the digital data to have poor DSV characteristics.

According to a further aspect of the invention, there is provided a copy protected optical disc having encoded digital data recorded thereon, and wherein some of the digital data recorded on the optical disc has unbalanced dc content.

In an embodiment of a copy protected optical disc of the invention, selected areas of the recorded digital data on the optical disc have unbalanced dc content.

In one embodiment, selected areas of the recorded digital data which have unbalanced dc content have been predetermined.

In an alternative embodiment, selected areas of the recorded digital data which have unbalanced dc content have been randomly selected.

Preferably, the size of each said selected area is restricted.

Where the digital data recorded onto the optical disc has been arranged in frames, each said selected area having unbalanced dc content may contain less than 100 frames.

Where the digital data recorded onto the optical disc has been arranged in sectors with each sector containing a plurality of frames, each said selected area having unbalanced dc content may contain less than 2 sectors. Preferably, each sector contains 98 frames.

In a preferred embodiment, some of the digital data recorded on the optical disc has been given unbalanced dc content by providing the recorded digital data with poor DSV characteristics.

For example, the DSV of the recorded digital data may have a rapid rate of change, and/or high absolute values, and/or substantial low frequency components.

The present invention is relevant to all formats of optical discs, for example, the optical disc may be a CD which has been subjected to EFM encoding, or the optical disc may be a DVD which has been subjected to EFMPlus encoding.

Similarly, the invention is applicable irrespective of the type of information carried by the optical disc. For example, the digital data recorded on the optical disc may be one or more of: audio data, video data, graphics data, visual data, animation data, numerical data, program data, control and access data, and/or any other data.

The invention also extends to a data file enabling digital data to be encoded and copy protected by a method as defined above.

Such a data file may be arranged to be executable.

The present invention also extends to a data file for enabling digital data to be recorded in an encoded and copy protected form on an optical disc, the data file having an algorithm for enabling the selection of digital data to be specially encoded, and then for enabling encoding of the selected digital data such that it has unbalanced dc content.

A data file of the invention, which may or may not be an executable file, is intended for use by an encoder for the optical disc. For example, the data file may be utilised by the encoder of a laser beam recorder during mastering of an optical disc.

The encoder is enabled or controlled by the algorithm to select areas of the digital data for special encoding, and it is this special encoding which adds the unbalanced dc content to the master disc.

Where the digital data is to be encoded using EFM encoding with merge bits chosen during encoding inserted between successive channel bits, the data file algorithm enables merge bits to be chosen to give poor DSV characteristics to the selected digital data.

Where the digital data is to be encoded using EFMPlus encoding where each 8 bit data word is encoded into one of a choice of four 16 bit channel words, the data file algorithm enables 16 bit channel words to be chosen to give poor DSV characteristics to the selected digital data.

In an embodiment, the algorithm enables selected areas of the digital data to be chosen for special encoding, each selected area being restricted in size.

For example, the algorithm determines the number of frames to be contained within one said selected area of the digital data.

One said selected area may have less than 100 frames.

In an embodiment, the algorithm determines the encoding for each said selected area of the digital data which would provide good DSV characteristics, compares the good DSV value with a predetermined DSV value, and then changes the encoding for each said selected area such that the DSV value approaches the predetermined value whereby poor DSV characteristics are given to each said selected area.

BRIEF DESCRIPTION

Figure 2:
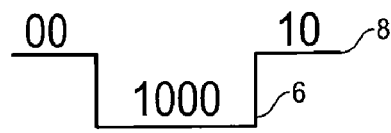
Figure 3:
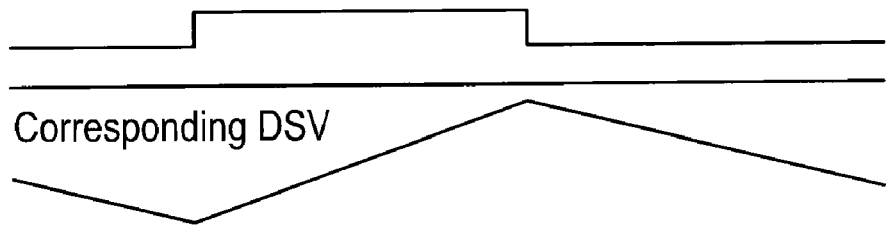
Figure 4:
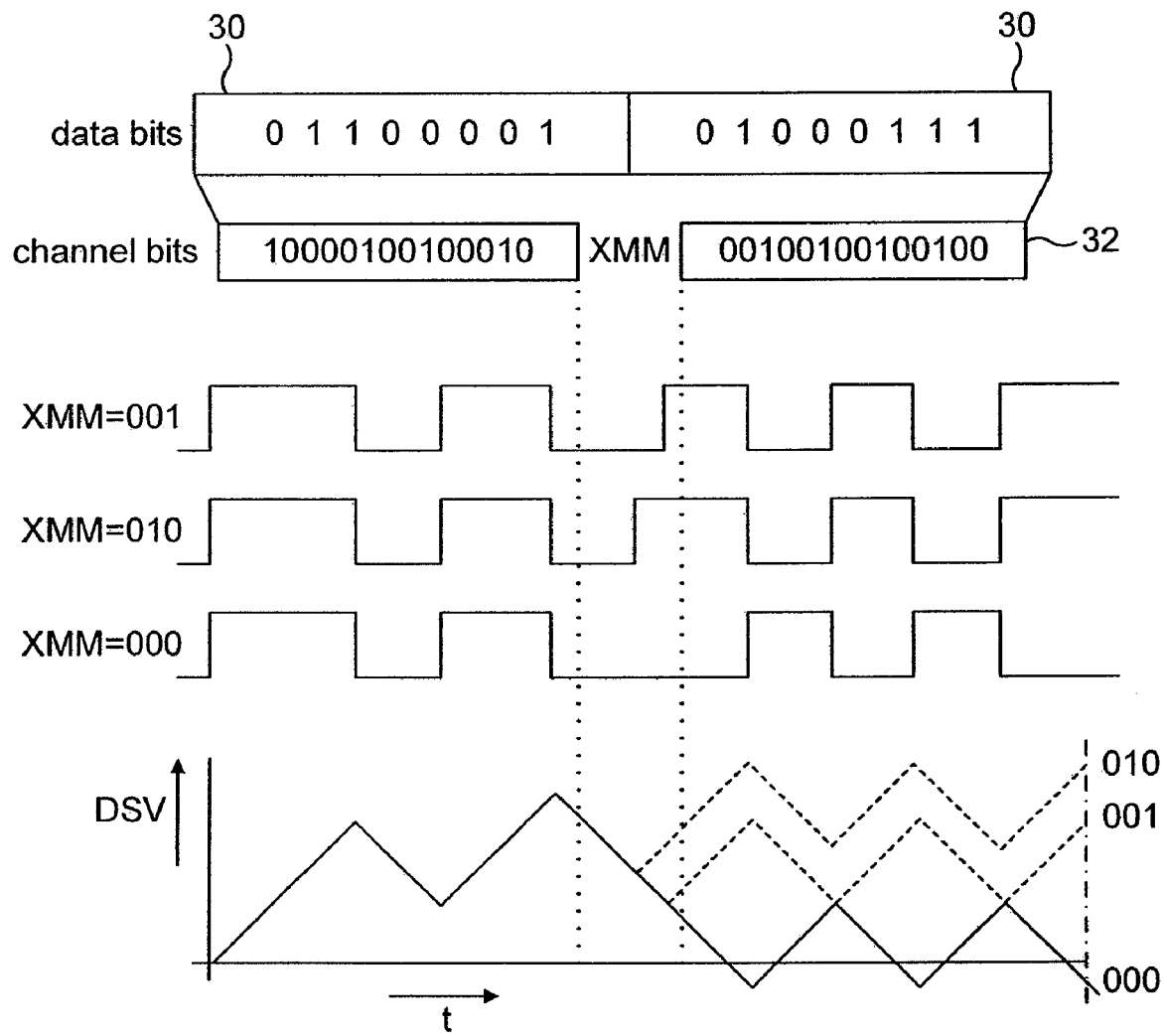
Figure 5:
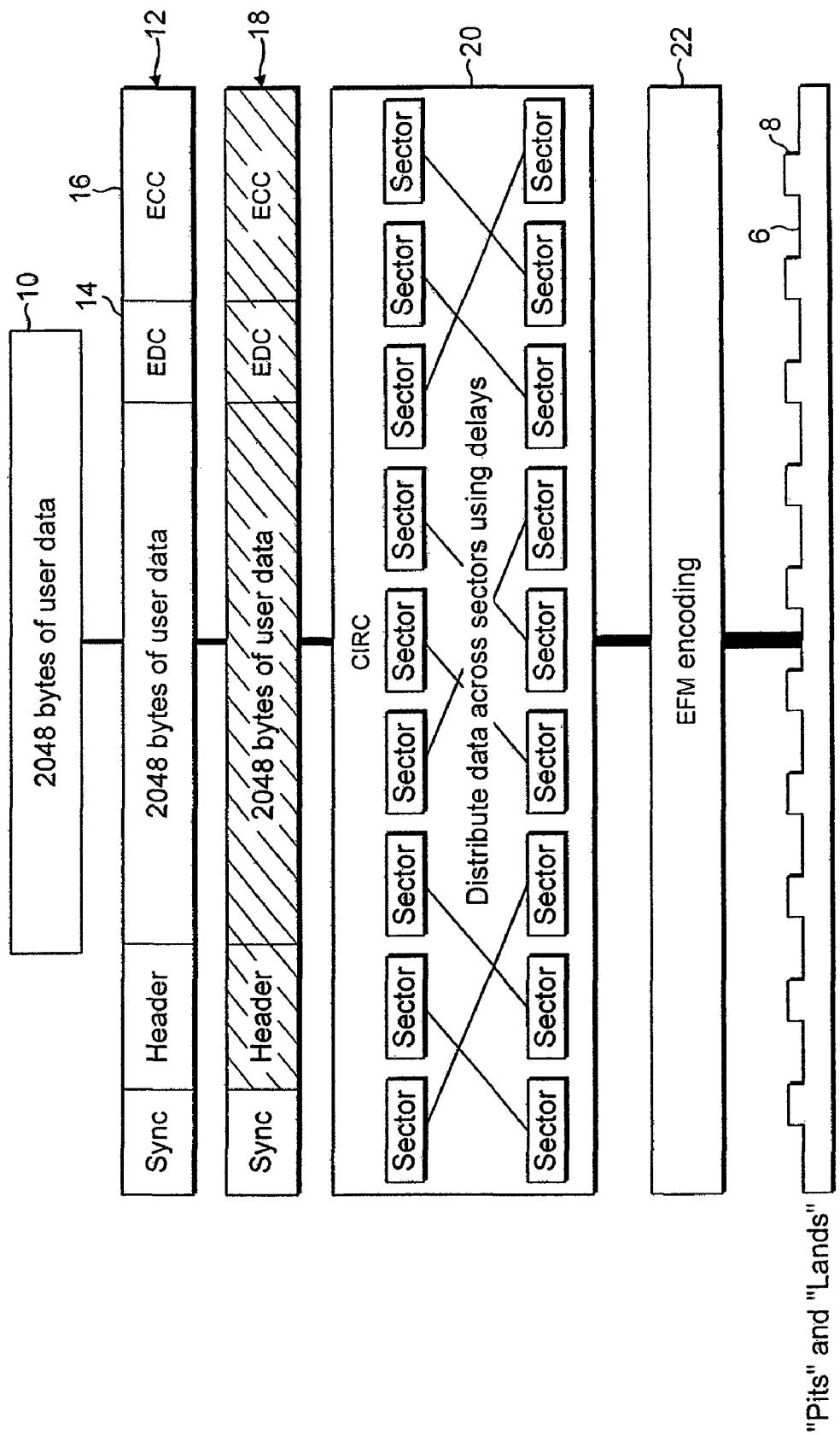
Figure 6:
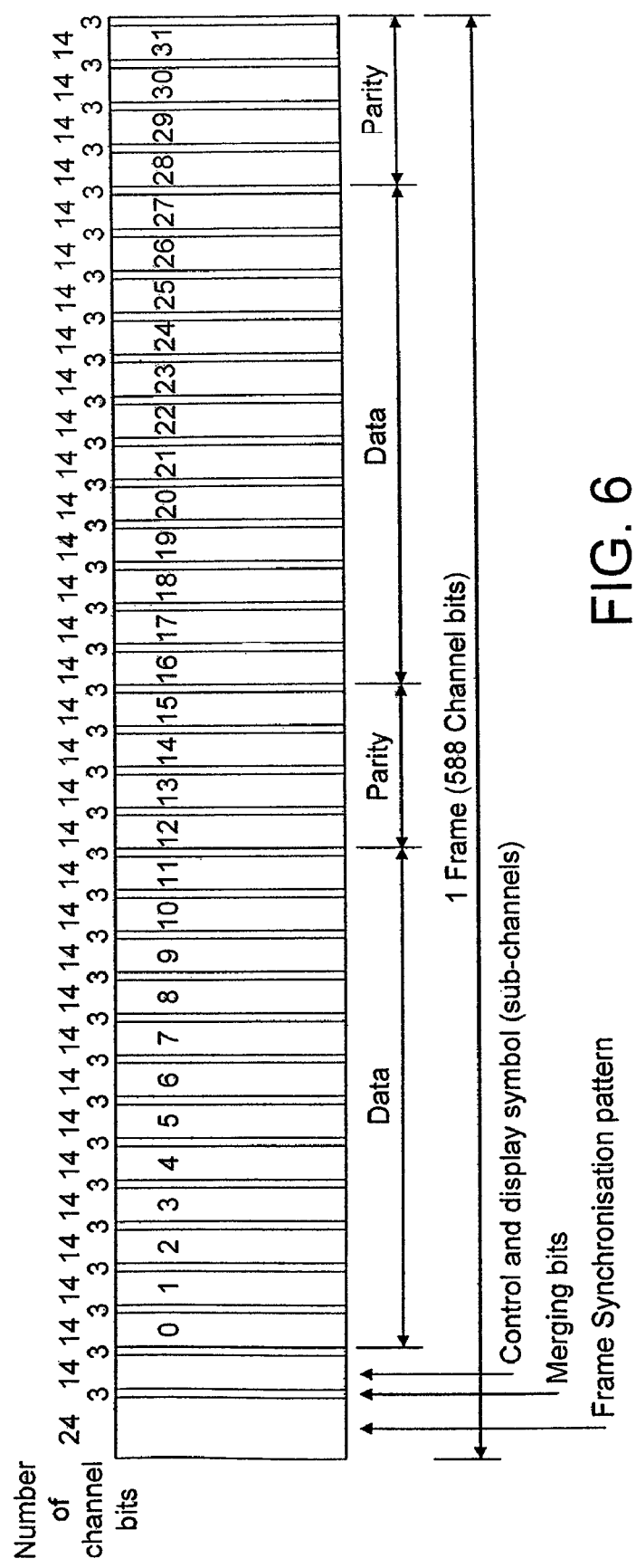
Figure 7:
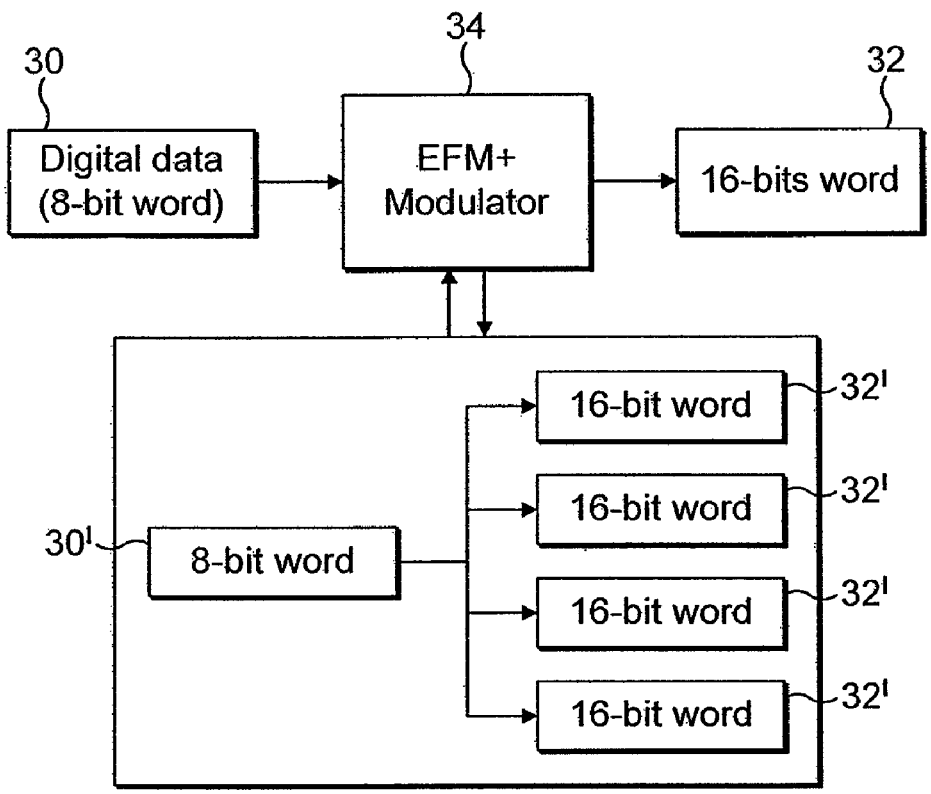
Figure 8:
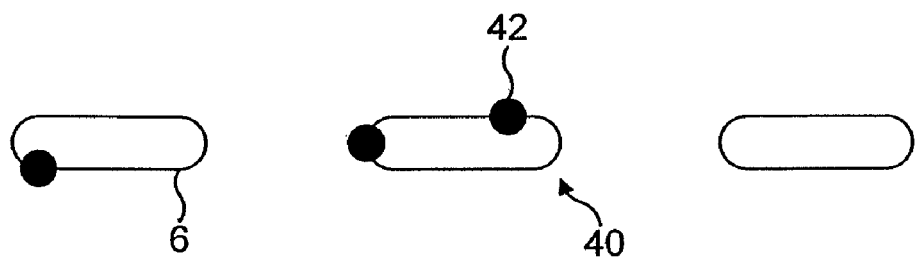
Figure 9:
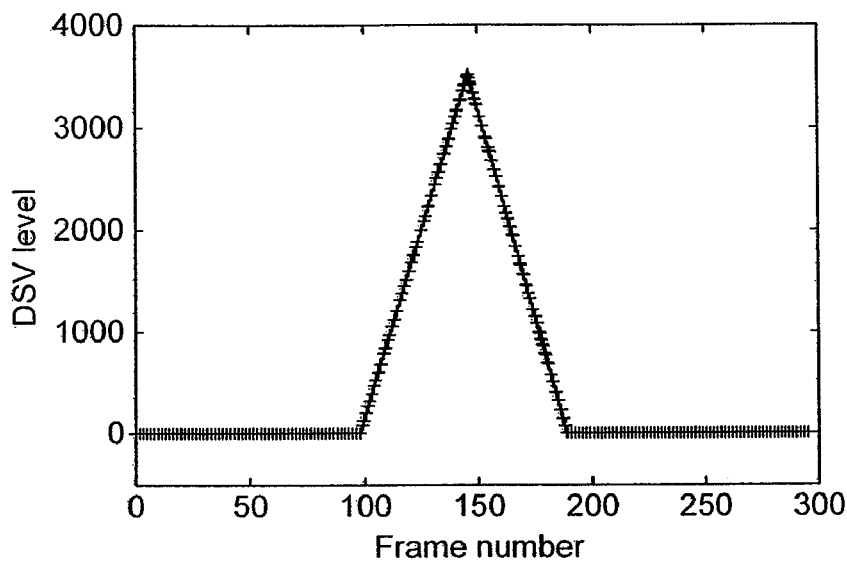
Figure 11:
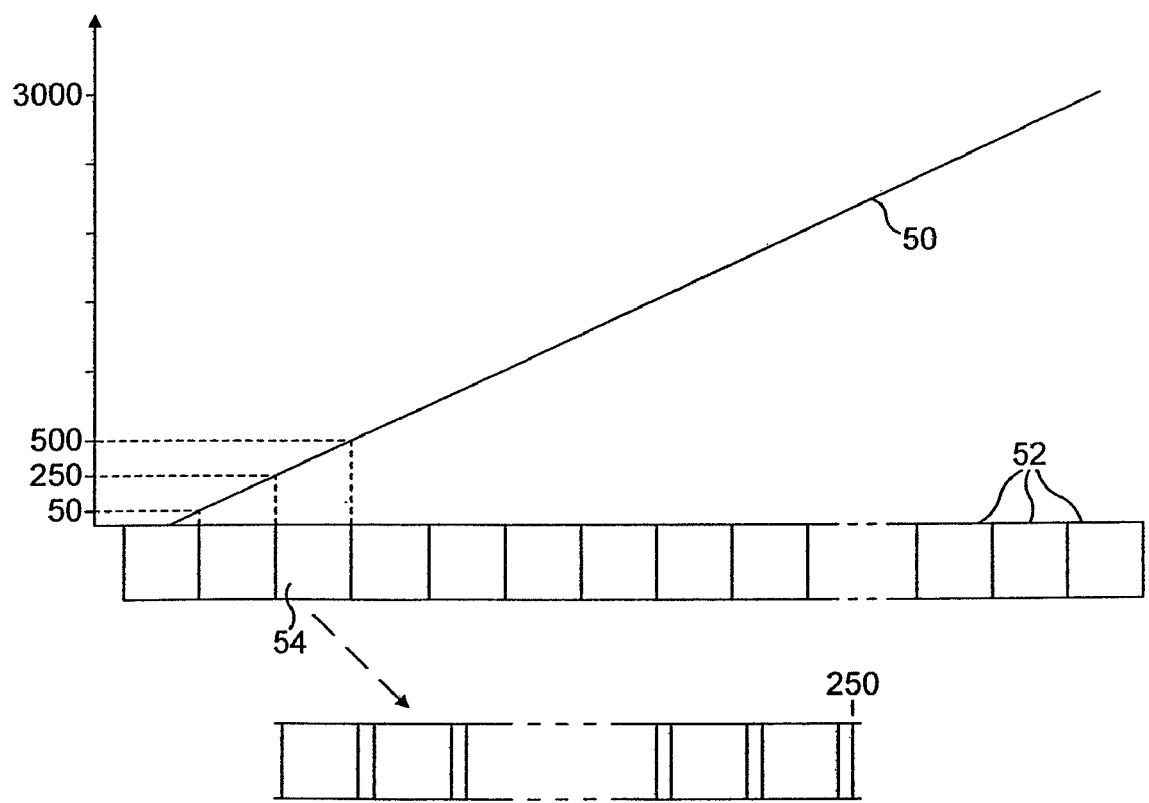
Figure 10A:
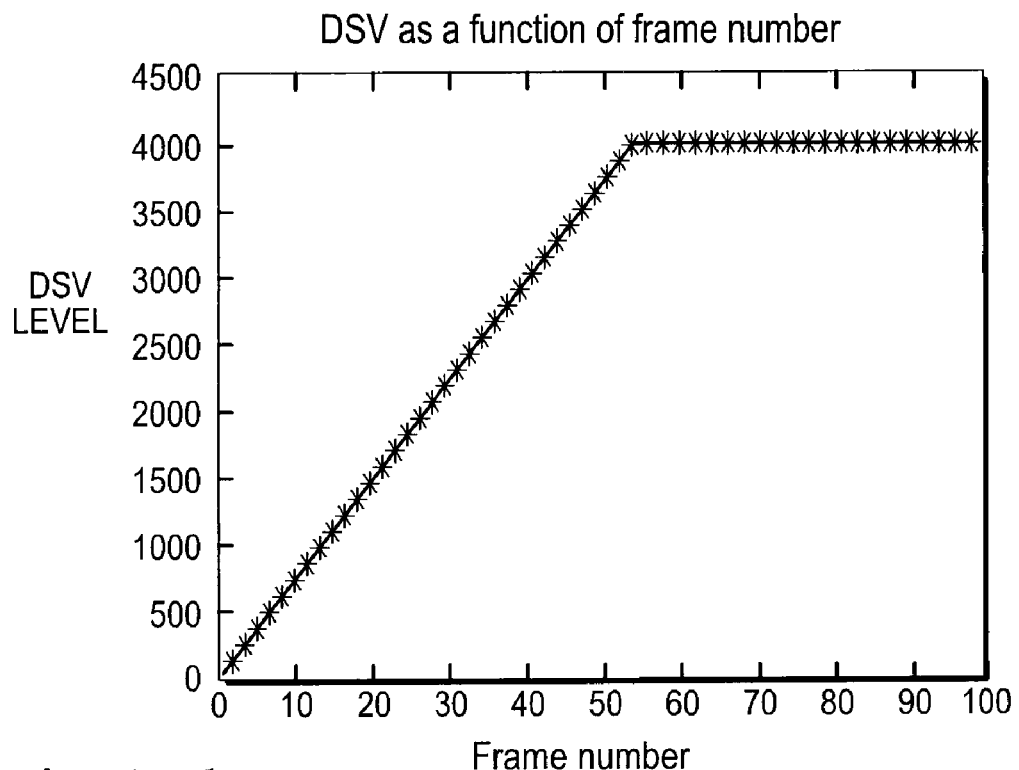
Figure 10B:
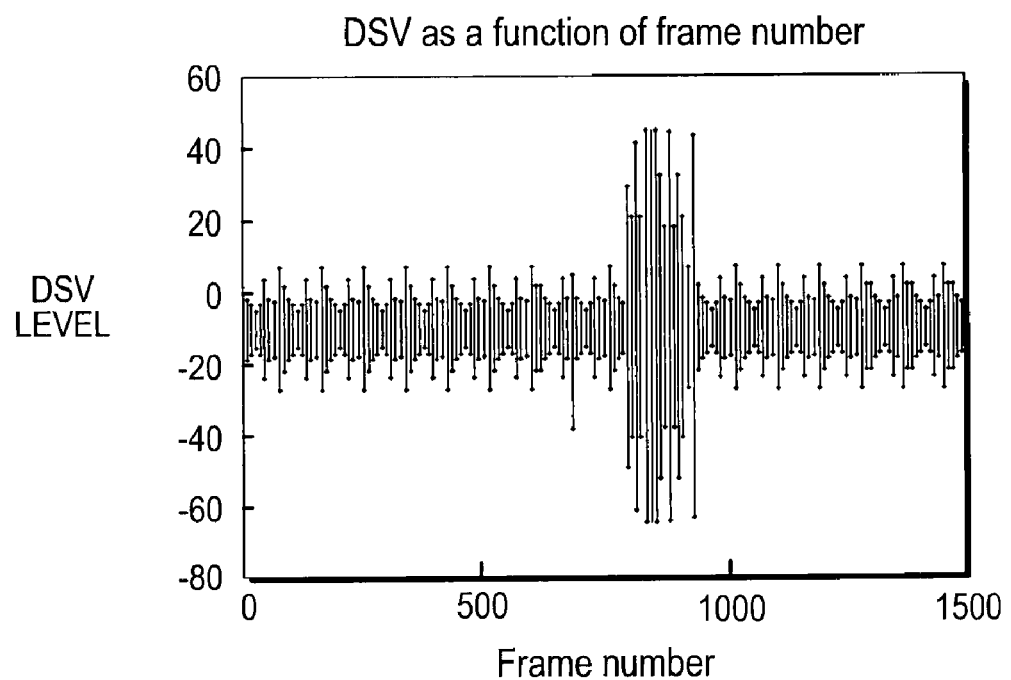
Figure 10C:
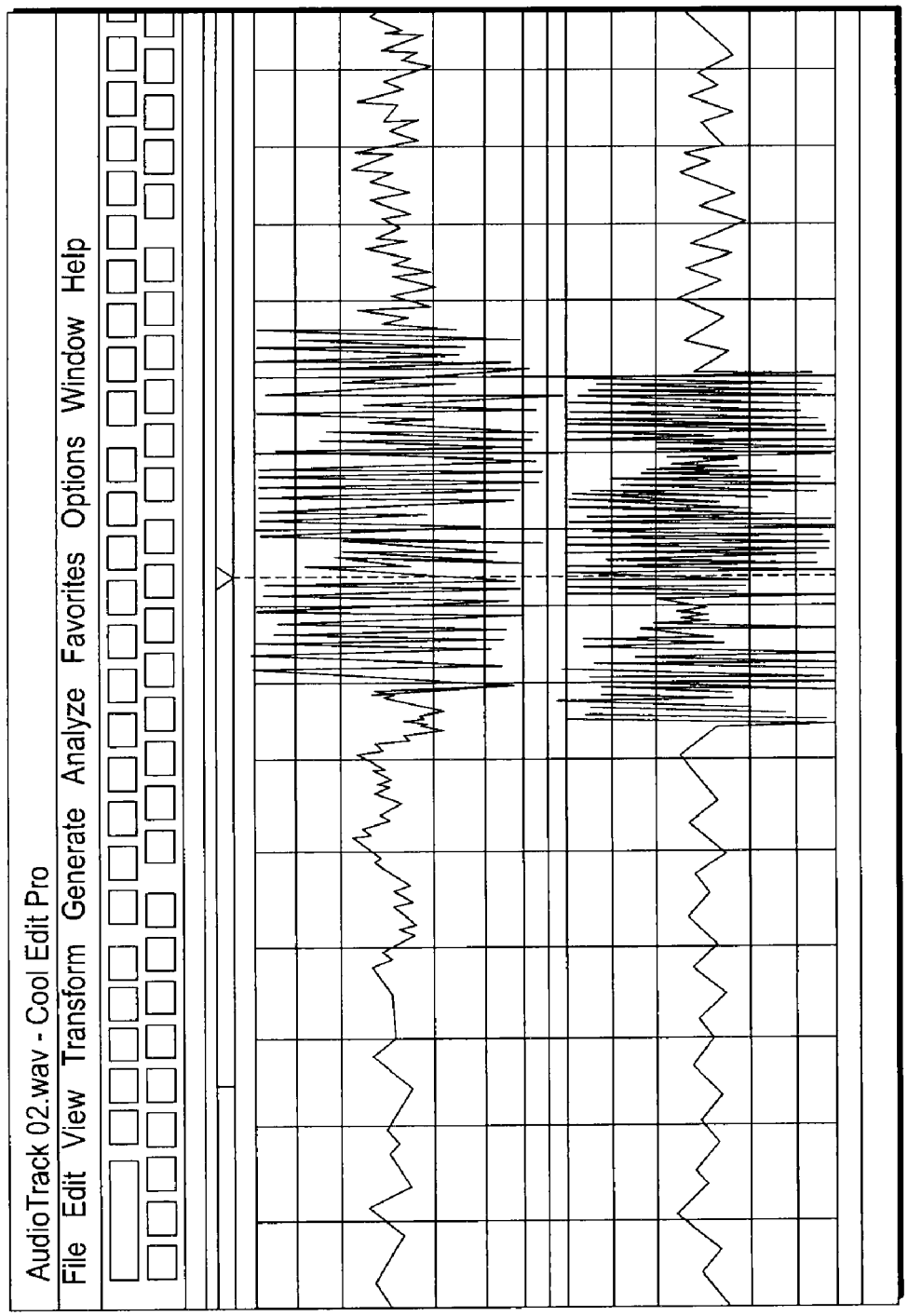

Embodiments of the present invention will hereinafter be described, by way of example, with reference to the accompanying drawings, in which:

FIG. 1 shows an enlarged view of a CD showing the pits and lands,

FIG. 2 shows a section through a pit and land illustrating the data encoding thereof, FIG. 3 illustrates the DSV corresponding to the encoded data, FIG. 4 shows schematically the manner in which merge bits can be chosen, FIG. 5 shows schematically the encoding of data onto a CD, FIG. 6 illustrates a frame in the encoded data, FIG. 7 illustrates EFMPlus encoding, FIG. 8 shows schematically part of a spiral track on an optical disc and its tracking, FIG. 9 illustrates poor DSV characteristics to be encoded onto a disc, FIG. 10 illustrates the effect of poor DSV characteristics, with FIG. 10a showing the DSV characteristic, FIG. 10b showing the associated dc content, and FIG. 10c showing the distortions in audio produced thereby, and FIG. 11 graphically illustrates the encoding algorithm.

DETAILED DESCRIPTION

This description specifically explains the encoding of a CD-ROM and the use of the present invention for copy protecting such a CD-ROM. However, it will be appreciated that the present invention is not limited to use with a CD-ROM and finds application to all data carrying optical discs. Specifically, the invention is applicable to all formats of CDs and to all formats of DVDs.

Furthermore, the description which follows gives one example of the encoding of data onto a CD. Other encoding modes are possible and it will be appreciated that the invention is not limited to the encoding mode.

FIG. 1 shows an enlarged view of part of a CD showing the pits 6 thereon. As is well known, these pits extend along a spiral track on the surface of the disc and are separated by lands.

FIG. 2 shows a section through a pit 6 and land 8 illustrating how data is encoded on a CD. The pits and lands do not represent binary 0s and 1s, but instead represent transitions from one state to another. The data signal is stored in NRZI form (Non-Return to Zero Inverted), where the signal is inverted every time a 1 is encountered. FIG. 2 shows the binary value 00100010.

The data stream always consists of pits and lands of at least 3 bits and at most 11 bits long. This is sometimes referred to as a 3T-11T where T is a 1 bit period. A 3T pit has the highest signal frequency (720 khz) and an 11T pit has the lowest signal frequency (196 khz).

A data signal is derived from the lengths of the pits and lands. The produced signal forms a square wave known as an EFM signal. The digital sum value (DSV) is the running difference between the number of T values where the EFM represents a pit and the number of T values where the EFM represents a land. As each data bit is read, the DSV is incremented or decremented depending upon whether the data bit corresponds to a pit or a land.

As indicated in FIG. 3, the DSV is determined by assigning the value +1 to each land T, and −1 to each pit T. Ideally, the DSV should stray as little as possible from the zero level. If the DSV has a rapid rate of change over a significant period of time or if the DSV has substantial low frequency components then the transitions in the EFM signal may be shifted from their ideal values and/or the ability of tracking and focus circuits in CD players or drives to maintain optimal head positioning may be compromised. This typically causes read failures from the CD. This is discussed further below.

Original data, in 8 bit bytes, is passed through a process called EFM encoding to produce the 14 bit symbols, often referred to as channel bits. The set of 14 bit symbols is especially designed:

to level out the number of pits and lands, to help maintain balanced DSV; and to ensure that there are no symbols which break the EFM coding scheme of 3T-11T.

Another way of regarding the 3T-11T run length limiting rules is that the number of successive zeros must be greater than two and less than ten. It is immediately apparent that this requirement may be compromised where two 14 bit symbols follow one after the other. Accordingly, a set of 3 merge bits are added between each 14 bit symbol and the one following to ensure that there are no violations of the 3T-11T coding scheme and to ensure that a suitable DSV is maintained.

FIG. 4 shows schematically the manner in which the merge bits can be chosen. In FIG. 4 there are shown two 8 bit data symbols 30. These are encoded into two 14 bit channel words 32, for example, by reference to a look up table. Then, to ensure that the resultant merged symbols 32 meet the run length limiting rules, three merge bits XMM are inserted between successive channel symbols 32.

In the example illustrated in FIG. 4, three combinations of merge bits XMM are possible. FIG. 4 shows the transitions for the merged words for each choice of the merge bits XMM and also shows the DSV associated with each choice. In the embodiment illustrated, the merge bits 000 give a DSV value of −1, the merge bits 010 give a DSV value of +7, and the merge bits 001 give a DSV equal to +6. In most cases, therefore, the encoder will choose the merge bits 000 to give the lowest absolute DSV value.

FIG. 5 shows schematically the encoding of data onto a CD in the form of pits 6 and lands 8. Initially, and as indicated, there are 2048 bytes of user data. This is indicated at 10. Then, as illustrated at 12, a sync block, a header, an error detection code (EDC) 14 and error correction code (ECC) 16 are added to those original 2048 bytes.

To help ensure that the final arrangement of pits and lands meet the EFM coding rules for DSV, the data at 12 is then scrambled as shown at 18 using an XOR algorithm. The scrambling seeks to reduce the likelihood that plausible repeating patterns of user data would inadvertently correspond to DSV problem causing patterns by effectively randomising the data across a sector.

As indicated at 20, the data is then passed to the CIRC encoder. The CIRC encoder, by means of delays, distributes the data across a number of sectors. The data is then passed to the EFM encoder 22 where the 8 bit data words are translated into the 14 bit channel words and the merge bits are inserted to form the pattern of 1's and 0's. It is the EFM encoded data which is converted into the series of pits and lands on the disc.

As is also known, the encoded data on a CD is arranged in frames. The format of a frame is illustrated in FIG. 6 which shows that each frame has sync data, sub-code bits providing control and display symbols, and parity bits together with data bits. Each frame includes 24 bytes of data, which, for a CD-DA, for example, is audio data.

There are 8 sub-code bits contained in every frame and designated as P, Q, R, S, T, U, V and W. Generally only the P and Q sub-code bits are used in the audio format. The standard requires that 98 of the frames of FIG. 6 are grouped into a sector, and the sub-code bits from the 98 frames are collected to form sub-code blocks. That is, each sub-code block is constructed a byte at a time from 98 successive frames. In this way, 8 different subchannels, P to W, are formed. These subchannels contain control data for the disc. The P- and Q-subchannels incorporate timing and navigation data for the tracks on the disc.

The data encoding on a CD-DA and on a CD-ROM, which is briefly described above, is well known and in accordance with international standards. Accordingly, it is not necessary to further describe the encoding, nor the rules to which it complies, as both are well known and understood to those skilled in the art.

Similarly, the encoding schemes and compliance rules for DVDs are well known and will not be described in detail herein. In this respect, DVDs do not use an EFM encoding scheme with merge bits as described above. DVDs use an encoding scheme known as EFMPlus which is schematically illustrated in FIG. 7. In EFMPlus, the 8 bit data words indicated at 30 are translated into 16 bit channel words, indicated at 32, by way of the EFMPlus modulator 34. This EFMPlus modulator 34 incorporates a number of look up tables which provide a choice of four 16 bit words 32 for each input 8 bit word 30. The algorithm controlling the modulator 34 manipulates the choice of the 16 bit words 32 to minimise and control DSV.

As set out above, one of the reasons for wishing to keep good DSV characteristics is that poor DSV characteristics can provide tracking problems, for example, in disc readers and players. In this respect, the DSV represents the dc content of the data signal derived from the pits and lands on the disc. If that output data signal has a dc offset, tracking problems can occur.

FIG. 8 shows schematically part of a spiral track 40 on the surface of an optical disc and shows a number of pits 6 therein. The pits and lands are to be read by one or more lasers (not shown) which have a beam, as 42, which is focused on the track 40. A servo motor is required to maintain precise alignment between the laser beam 42 and the track 40, and between the laser beam 42 and the transition boundaries between the pit and land areas. If the data signal does not have a proper balance of high and low dc, such that the overall dc content is zero, there is the risk that the servo motor will drift out of proper alignment with the track 40.

Disc readers and players are provided with appropriate tracking systems (not shown) to keep the laser beam 42 centred on the track 40. As it plays a CD-DA, for example, the tracking system has to continually move the laser outwardly from the centre of the disc towards its periphery. As the laser moves outwardly the pits 6 move past the laser beam 42 at an increased and increasing speed. It will be appreciated that this speed increase occurs because the tangential speed of the pits is equal to the radius multiplied by the speed at which the disc revolves. Therefore, as the laser moves outwardly, the spindle motor (not shown) which rotates the disc must slow the speed of the optical disc. In this way it is ensured that the pits travel past the laser beam at a constant speed and that the data is read from the disc at a constant rate.

It is because the laser tracks the spiral of data using the pits that there cannot be extended gaps where there are no pits in the data track. This leads to the run length limiting rules described above.

Thus, it is generally required to encode data onto a disc such that the DSV does not have high absolute values, does not change rapidly, and does not have low frequency components. This latter requirement means that the DSV does not oscillate in a regular fashion. All these requirements ensure balanced dc content. As set out above, a balanced dc content helps the tracking system of a reader or player to keep the laser beam centred on the track during data read out.

The applicants now, radically, suggest that digital data recorded on an optical disc should be given an unbalanced dc content, and that the unbalanced dc content created can be used to provide copy protection for optical discs.

In this respect, and as shown in FIG. 9, in one embodiment the DSV value of the encoded data is changed rapidly in less than 100 frames. In the example shown in FIG. 9, in less than 100 frames the DSV is changed from 0 to 3000 and then back again to 0. It is thought that where the dc content is unbalanced for less than two sectors, the run length limiting rules are not compromised so that no timing violations are introduced. It is also thought that the value of the DSV can be increased up to 10000 without any such violations occurring.

As discussed above, the existence of unbalanced dc content would generally force the servo motor of a player or reader to move out of proper alignment with the spiral track. However, because the unbalanced dc content is introduced in selected areas which are restricted in size, the unbalanced dc content appears to a player or reader as burst errors and is generally well handled by players. In this respect, audio and video players traditionally play at a speed of 1×, which equals a data transfer rate of 176.4 kbytes per second. Data readers, which may read at a speed of 50× and greater, are much more susceptible to the existence of unbalanced dc content. A data reader accessing the copy protected data may experience error messages, data errors and/or jitter.

However, it is software provided for the purpose of copying or ripping content from optical discs which is the most susceptible to the unbalanced dc content. Traditional ripping software, which uses buffering technology to retrieve data from a disc, reads the data in a sector for input into a first buffer, and then reads the data again in the same sector for input into a second buffer. The software requires the contents of the two buffers to be the same as a check that the data extracted is correct. The loss of tracking caused by the unbalanced dc content makes it difficult, as set out above, to reliably extract the data at all. However, it is even more difficult for the software to access the same position on two separate occasions and to retrieve the same data therefrom. It is expected that such ripping techniques will fail to retrieve the data. Thus, the unbalanced dc content acts to copy protect the information stored on the disc.

FIG. 10 illustrates the problems which a data reader will have when it tries to read data from an optical disc protected by a method of the invention. In FIG. 10a there is shown an area of digital data on the optical disc in which the DSV has been caused to rise steeply over a limited number of frames. In this illustration, for example, the DSV rises to 4000 over 53 frames. FIG. 10b shows the modified dc content associated with the same area of the disc, whilst FIG. 10c shows heavy distortions in audio arising during an attempt to copy an audio track which has the single segment of unbalanced dc content as illustrated in FIG. 10a.

The size, nature and frequency of occurrence of the areas of unbalanced dc content applied to an optical disc can be chosen as required. Currently it is proposed to introduce unbalanced dc content in the form of rapidly increasing DSV or as an oscillating DSV pattern. The unbalanced dc content may be applied to the optical disc alone or in addition to other copy protection or identification techniques.

The unbalanced dc content may also be used in an authentication or signature technique. In this respect, it will be known where the unbalanced content has been located on a disc. A disc can then be checked to ensure that there is unbalanced data content at a particular location either to authenticate a disc or to control its use.

Furthermore, it is possible to apply the unbalanced dc content to localised areas only of an optical disc to protect data in those localised areas from access.

As set out above, for a CD the value of the merge bits is chosen by the encoder, for example, of a laser beam recorder, to minimise the DSV on a master disc. One method of adding unbalanced dc content to an optical disc, therefore, is to require the encoder to introduce a specific combination of merge bits at particular locations on the optical disc during mastering. This can be done, for example, by the following encoding algorithm:

1. Determine the length in frames of the segment where unbalanced dc content will be created.
2. Determine the desired DSV pattern by creating a one-dimensional vector which stores the values of DSV required after each frame in the segment. The length of this vector is equal to the number of frames in the segment.
3. For each frame in the segment:
    3.1 For each EFM symbol in the frame (14 channel bits):
        3.1.1. Read the following EFM symbol.
        3.1.2. Determine the legal combinations of merge bits between current and following EFM symbols.
        3.1.3. For each legal combination of merge bits:
            3.1.3.1. Calculate the DSV value which occurs after the following EFM symbol.
            3.1.3.2. Calculate the difference between the desired DSV value predetermined for the particular frame and that calculated in 3.1.3.1.
        3.1.4. Choose the combination of merge bits which minimises the value calculated in 3.1.3.2.
        3.1.5. If more than one such combination of merge bits exists, choose one that results in an EFM signal transition (pit-land, or land-pit).
    3.2 Encode the frame using the merge bit combinations calculated in 3.1.

This algorithm is shown graphically in FIG. 11 in which the DSV pattern 50 desired for a sequence of frames 52 is indicated. As shown, the DSV is caused to increase at a rapid rate. The DSV at the end of one frame 54 would be 250 or lower under normal encoding but, by way of the algorithm is brought to be as near to 500 as possible. This process carries on with successive frames 52 such that the desired DSV profile is achieved.

It will be appreciated that variations in and amendments to the embodiments as described may be made within the scope of this application as defined in the accompanying claims.

The invention claimed is:

1. A method of copy protecting an optical disc on which encoded digital data is recorded, the method comprising:
    encoding and recording the digital data onto the optical disc in a manner which is arranged to give some of the recorded digital data unbalanced dc content;
    wherein the unbalanced dc content allows playing of the digital data but prevents extracting the digital data from the disc and the unbalanced dc content is given to selected areas of the recorded digital data on the disc; and
    wherein the unbalanced dc content changes strictly monotonically over at least 50 frames of the selected area, each frame including 24 bytes of data.

2. The method of copy protecting an optical disc according to claim 1, further comprising predetermining the selected areas of the recorded digital data which are to be given the unbalanced dc content.

3. The method of copy protecting an optical disc according to claim 1, further comprising randomly selected the selected areas of the recorded digital data which are to be given the unbalanced dc content.

4. The method of copy protecting an optical disc according to claim 1, further comprising recording the digital data onto the optical disc in frames arranged into sectors each having a plurality of frames, and providing that each selected area having the unbalanced dc content contains less than 2 sectors.

5. The method of copy protecting an optical disc according to claim 4, wherein each sector contains 98 frames.

6. The method of copy protecting an optical disc according to claim 1, wherein some of the recorded digital data is given the unbalanced dc content by providing the recorded digital data with poor DSV (digital sum value) characteristics.

7. The method of copy protecting an optical disc according to claim 6, wherein the DSV of the recorded digital data has substantial low frequency components.

8. The method of copy protecting an optical disc according to claim 1, wherein the recorded digital data on the optical disc is given the unbalanced dc content by encoding the selected areas of the digital data to have poor DSV (digital sum value) characteristics.

9. The method of copy protecting an optical disc according to claim 8, wherein the DSV of the recorded digital data has a rapid rate of change.

10. The method of copy protecting an optical disc according to claim 8, wherein the DSV of the recorded digital data has high absolute values.

11. The method according to claim 1, wherein the digital data is encoded using EFM encoding where merge bits chosen during the encoding are inserted between successive channel bits, and wherein the merge bits are chosen to give poor DSV (digital sum value) characteristics to the selected digital data.

12. The method according to claim 1, wherein the digital data is encoded using EFMPlus encoding where each 8 bit data word is encoded into one of a choice of four 16 bit channel words, and wherein the 16 bit channel words are chosen to give poor DSV (digital sum value) characteristics to the selected digital data.

13. The method of copy protecting an optical disc according to claim 1, wherein the change is increasing or decreasing.

14. A copy protected optical disc having data comprising encoded digital data recorded thereon, wherein some of the recorded digital data have unbalanced dc content, wherein the unbalanced dc content is given to selected areas of the digital data and wherein the unbalanced dc content allows playing of the digital data but prevents extracting the digital data from the disc and wherein the unbalanced dc content changes strictly monotonically over at least 50 frames of the selected area, each frame including 24 bytes of data.

15. The copy protected optical disc according to claim 14, further comprising predetermining the selected areas of the recorded digital data which are to be given the unbalanced dc content.

16. The copy protected optical disc according to claim 14, further comprising randomly selected the selected areas of the recorded digital data which are to be given the unbalanced dc content.

17. The copy protected optical disc according to claim 14, further comprising recording the digital data onto the optical disc in frames arranged into sectors each having a plurality of frames, and providing that each selected area having the unbalanced dc content contains less than 2 sectors.

18. The copy protected optical disc according to claim 14, wherein each sector contains 98 frames.

19. The copy protected optical disc according to claim 14, wherein some of the recorded digital data is given the unbalanced dc content by providing the recorded digital data with poor DSV (digital sum value) characteristics.

20. The copy protected optical disc according to claim 14, wherein the recorded digital data on the optical disc is given the unbalanced dc content by encoding the selected areas of the digital data to have poor DSV (digital sum value) characteristics.

21. The copy protected optical disc according to claim 20, wherein the DSV of the recorded digital data has a rapid rate of change.

22. The copy protected optical disc according to claim 20, wherein the DSV of the recorded digital data has high absolute values.

23. The copy protected optical disc according to claim 20, wherein the DSV of the recorded digital data has substantial low frequency components.

24. The copy protected optical disc according to claim 14, wherein the selected areas of the recorded digital data which have the unbalanced dc content are predetermined.

25. The copy protected optical disc according to claim 14, wherein the selected areas of the recorded digital data which have the unbalanced dc content are randomly selected.

26. The copy protected optical disc according to claim 14, wherein the optical disc is a CD (compact disc) and the encoded digital data has been subjected to EFM encoding.

27. The copy protected optical disc according to claim 14, wherein the optical disc is a DVD (digital video disc) and has been subjected to EFMPlus encoding.

28. The copy protected optical disc according to claim 14, wherein the digital data recorded on the optical disc is one or more of audio data, video data, graphics data, visual data, animation data, numerical data, program data, control and access data, and/or any other data.

29. The copy protected optical disc according to claim 14, wherein the digital data is encoded using EFM encoding where merge bits chosen during the encoding are inserted between successive channel bits, and wherein the merge bits are chosen to give poor DSV (digital sum value) characteristics to the selected digital data.

30. The copy protected optical disc according to claim 14, wherein the digital data is encoded using EFMPlus encoding where each 8 bit data word is encoded into one of a choice of four 16 bit channel words, and wherein the 16 bit channel words are chosen to give poor DSV (digital sum value) characteristics to the selected digital data.

31. The copy protected optical disc according to claim 14, wherein the change is increasing or decreasing.

* * * * *